(12) United States Patent
Hamachi (10) Patent No.: US 6,633,080 B2
(45) Date of Patent: Oct. 14, 2003

(54) SEMICONDUCTOR DEVICE (75) Inventor: Hiroaki Hamachi, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/106,368

(22) Filed: Mar. 27, 2002

(65) Prior Publication Data

US 2003/0062608 A1 Apr. 3, 2003

(30) Foreign Application Priority Data

Oct. 2, 2001 (JP) ........................................ 2001-306311

(51) Int. Cl.⁷ .............................................. H01L 23/48
(52) U.S. Cl. ........................................ 257/730; 257/678
(58) Field of Search ................. 257/678, 697, 257/730, 787, 666; 361/754

(56) References Cited

U.S. PATENT DOCUMENTS

| | | | | |
|---|---|---|---|---|
| 5,604,376 A | * | 2/1997 | Hamburgen et al. | 257/676 |
| 5,708,300 A | * | 1/1998 | Woosley et al. | 257/730 |
| 5,841,192 A | * | 11/1998 | Exposito | 257/701 |
| 6,046,501 A | * | 4/2000 | Ishikawa et al. | 257/730 |
| 6,320,251 B1 | * | 11/2001 | Glenn | 257/678 |
| 6,329,711 B1 | * | 12/2001 | Kawahara et al. | 257/698 |

* cited by examiner

Primary Examiner—David L. Talbott
Assistant Examiner—Lourdes Cruz
(74) Attorney, Agent, or Firm—Oblon, Spivak, McClelland, Maier & Neustadt, P.C.

(57) ABSTRACT

A transistor (200) is provided with a semiconductor chip (1) inside a resin package (20). An outer lead (41, 42, 43, 44) is arranged on a first side surface (23) of the resin package (20) to serve as an external drain electrode. A lead frame (5) includes the outer lead (41, 42, 43, 44) and a sheet-like portion (51). The sheet-like portion (51) is connected to a first surface (1a) of the semiconductor chip (1) for holding a drain electrode. An outer lead (45, 46, 47, 48) is arranged on a second side surface (24) of the resin package (20) to serve as an external source electrode. The outer lead (45, 46, 47, 48) is connected by a wire (4) to a second surface (1b) of the semiconductor chip (1) for holding a source electrode. An ejector pin site (22) formed on a top surface (21) of the resin package (20) is located on the side of the first side surface (23).

12 Claims, 9 Drawing Sheets

SEMICONDUCTOR DEVICE

BACKGROUND OF THE INVENTION

1. Field of the Invention

The present invention relates to a semiconductor device and more particularly, to the structure of a power transistor.

2. Description of the Background Art

Figure 7:
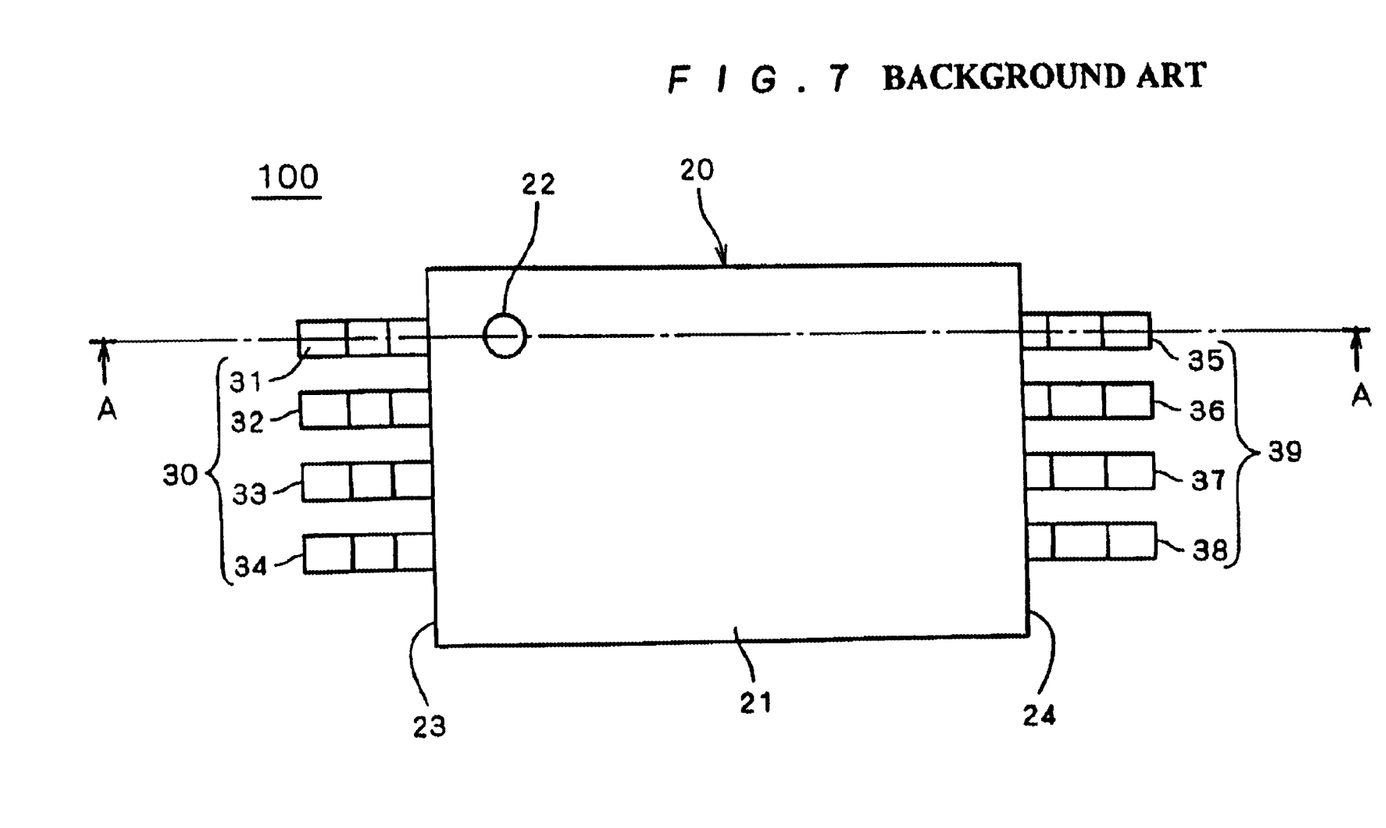
FIG. 7 is a plan view exemplifying the appearance of a semiconductor device in the background art.

FIG. 7 is a plan view exemplifying the appearance of a transistor 100 as a semiconductor device in the background art. The transistor 100 is of a TSSOP (thin shrink small outline package) type in external form. A power transistor of the TSSOP type belonging to surface mounting package has a height of approximately 1.1 mm in external shape and therefore, it is preferably used as a semiconductor element in a portable device such as a mobile telephone.

In appearance, the transistor 100 includes a resin package 20 and groups 30, 39 of outer leads. The resin package 20 has a first side surface 23 and a second side surface 24. Outer leads belonging to the groups 30 and 39 protrude from the first side surface 23 and the second side surface 24, respectively.

Figure 8:
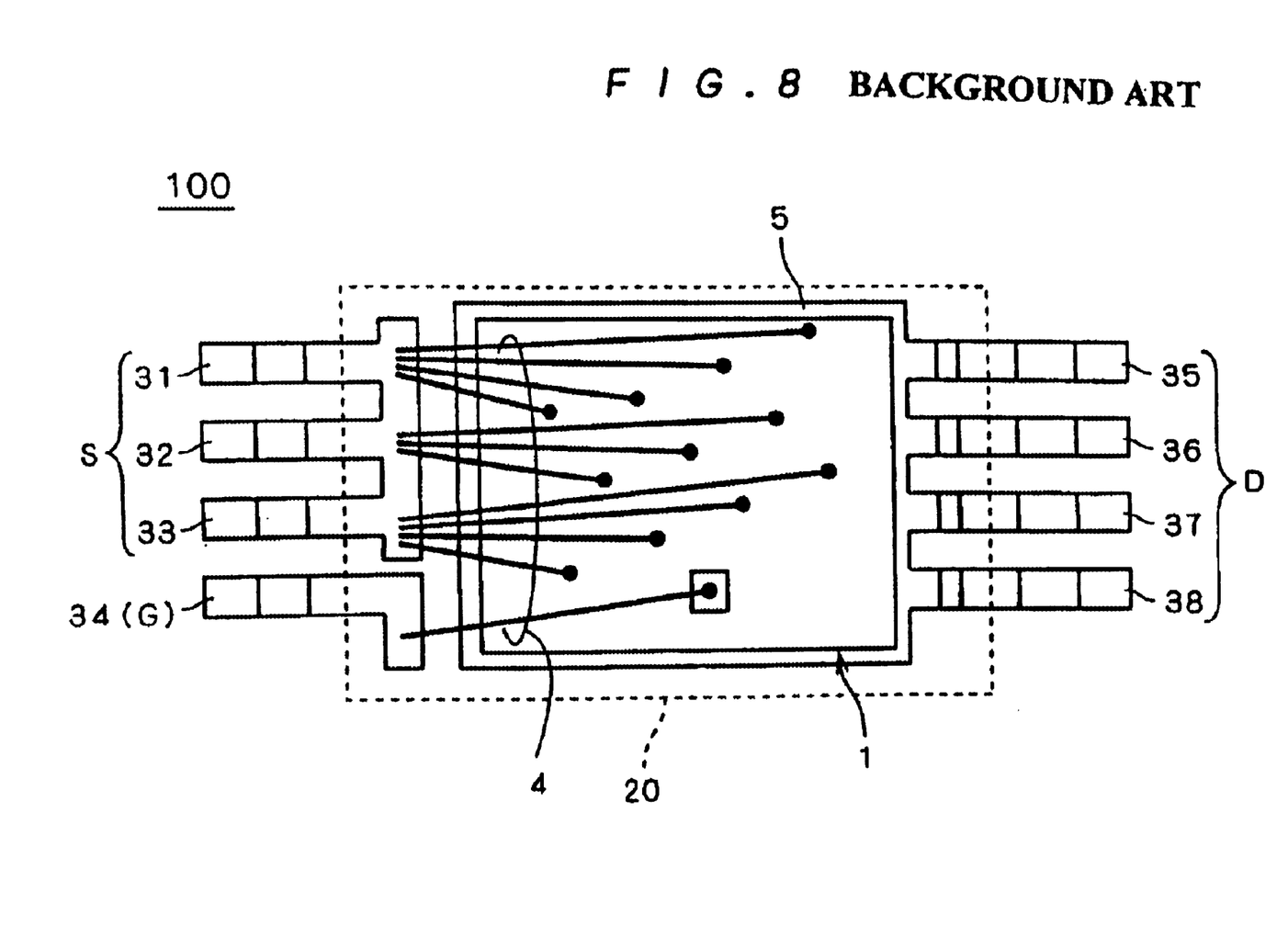
FIG. 8 is a plan view exemplifying the internal structure of the semiconductor device in the background art.
Figure 9:
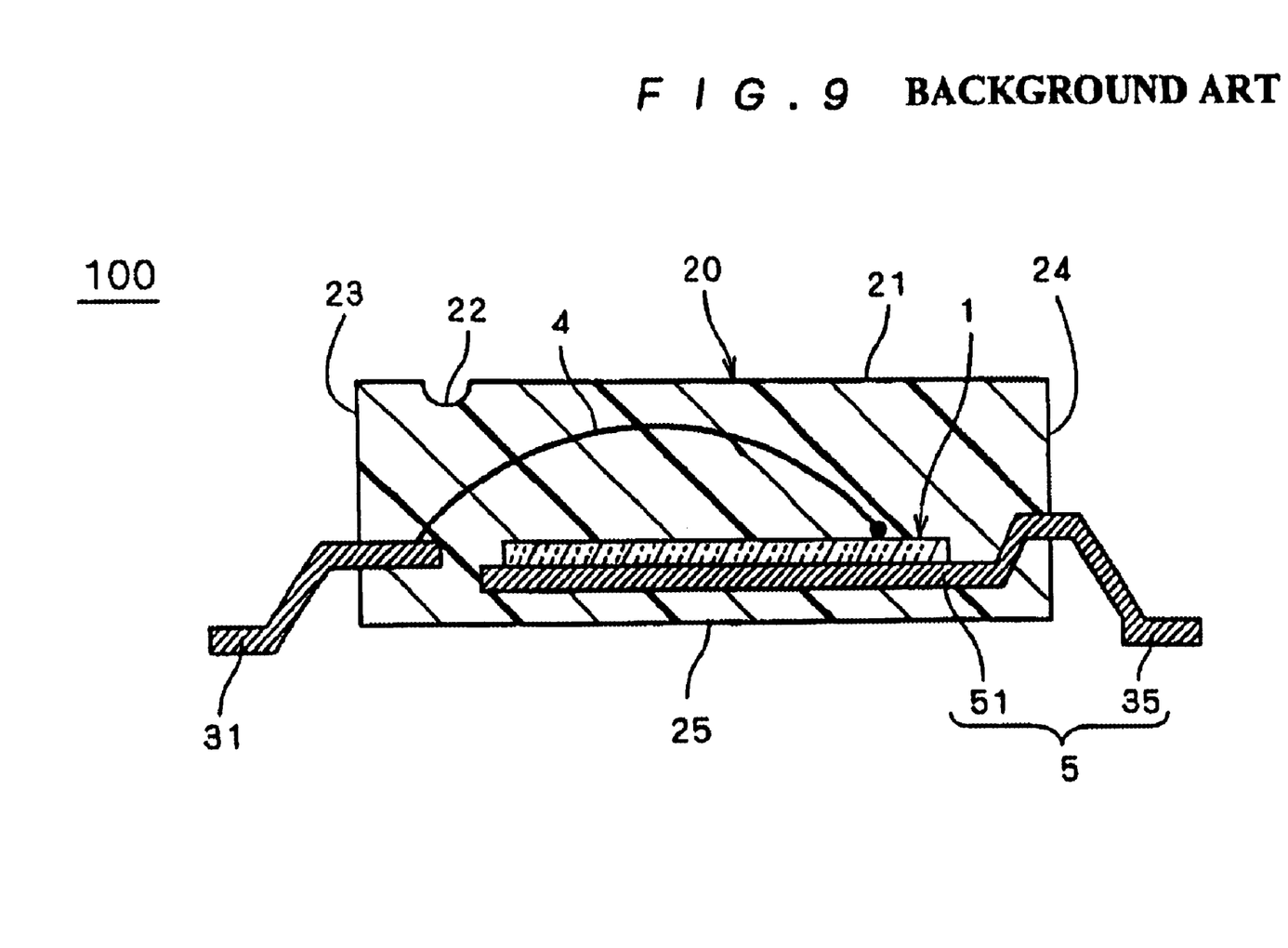
FIG. 9 is a cross-sectional view taken along a cutting plane line A—A in FIG. 7.

FIG. 8 is a plan view exemplifying the internal structure of the transistor 100. To provide description of the internal structure of the resin package 20, only the outline thereof is shown in a dashed line. FIG. 9 is a cross-sectional view of the transistor 100 taken along a cutting plane line A—A in FIG. 7.

The transistor 100 is provided with a semiconductor chip 1, a lead frame 5 and bonding wires 4 inside the resin package 20. The lead frame 5 includes the group 39 of outer leads at one end and a sheet-like portion 51 for holding the semiconductor chip 1 mounted thereon from the side of a bottom surface 25 of the resin package 20. One end of each bonding wire 4 is bonded to the semiconductor chip 1 from the side of a top surface 21 of the resin package 20 and the other end thereof is connected to one of the outer leads of the group 30.

The group 30 includes outer leads 31, 32, 33 each serving as an external source electrode S and an outer lead 34 serving as an external gate electrode G. The group 39 includes outer leads 35, 36, 37 and 38 each serving as an external drain electrode D.

By bonding the semiconductor chip 1 to the lead frame 5, establishing connection by the bonding wires 4 and performing sealing with a resin using a known technique, the transistor 100 including the resin package 20 is completed.

Similar to the usual plastic molding, the resin package 20 to be formed by sealing is ejected and detached from a molding die thereof by an ejector pin. At this time, a recessed portion is formed on the top surface 21 of the resin package 20 as an ejector pin recess site 22.

When the transistor 100 is a power transistor, it is desirable that the bonding wires 4 are independently connected to the outer leads 31, 32 and 33 from separate positions on the semiconductor chip 1, thereby allowing improvement in tolerance for current breakdown and reduction in on-state voltage. For such connection using the plurality of bonding wires 4, it is still desirable that the wires 4 are each suspended above the semiconductor chip 1 at a greatest possible height.

The thickness of the resin package 20 is small due to the TSSOP configuration of the transistor 100 in external form. Further, the semiconductor chip 1 and the group 30 of outer leads are connected by the bonding wires 4 on the side of the top surface 21 of the resin package 20. Accordingly, when the bonding wires 4 are each suspended above the semiconductor chip 1 at a great height, it is likely that the bonding wires 4 may be exposed from the top surface 21 to the outside of the resin package 20 resulting from the presence of the ejector pin site 22.

SUMMARY OF THE INVENTION

According to the present invention, a semiconductor device includes a semiconductor chip, a lead frame, at least one connector, a plurality of second outer leads and a package. In the semiconductor device according to the present invention, the semiconductor chip includes a first surface, a second surface and a semiconductor element. The semiconductor element has a first current electrode and a second current electrode. The first surface holds the first current electrode. The second surface holds the second current electrode and is opposite to the first surface. Further, in the semiconductor device according to the present invention, the lead frame includes a sheet-like portion and an end portion. The sheet-like portion is connected to the first current electrode on the first surface of the semiconductor chip. The end portion has a plurality of first outer leads. Still further, in the semiconductor device according to the present invention, the plurality of second outer leads are connected to the second current electrode by the at least one connector. Yet further, in this semiconductor device, the package includes a first side surface, a second side surface, a first surface, a second surface and a recessed portion. The first side surface holds the plurality of first outer leads arranged thereon. The second side surface holds the second outer leads arranged thereon and is opposite to the first side surface. The first surface is located farther from the semiconductor chip than the lead frame. The second surface is located farther from the semiconductor chip than the at least one connector and opposite to the first surface of the package. The recessed portion is formed on the second surface of the package on the side of the first side surface.

Preferably, the at least one connector is a metal plate or a plurality of metal wires.

Preferably, the semiconductor element further has a gate electrode. Further, the semiconductor device also includes a third outer lead arranged on the second side surface of the package and connected to the gate electrode.

According to the present invention, a method of manufacturing a semiconductor device includes steps of (a) to (c). In the step of (a), a semiconductor is provided. The semiconductor includes a semiconductor chip. The semiconductor chip includes a semiconductor element, first and second surfaces. The semiconductor element has a first current electrode and a second current electrode. The first electrode holds the first current electrode. The second surface holds the second current electrode and is opposite to the first surface. The semiconductor further includes a lead frame. The lead frame has a sheet-like portion and an end portion. The sheet-like portion is connected to the first current electrode on the first surface of the semiconductor chip. The end portion has a plurality of first outer leads. The semiconductor further includes at least one connector and a plurality of second outer leads. The plurality of second outer leads are connected to the second current electrode by the at least one connector. In the step of (b), the semiconductor chip, the lead frame and the at least one connector is sealed with a package. The package includes a first side surface, a second side surface, a first surface and a second surface. The first side surface holds the plurality of outer leads arranged thereon. The second side surface holds the second outer leads arranged thereon and is opposite to the first side surface. The first surface is located farther from the semiconductor chip than the lead frame. The second surface is located farther from the semiconductor chip than the at least one connector and opposite to the first surface of the package. In the step of (c), the package is ejected from a molding die by an ejector pin on the second surface of the package on the side of the first side surface. Thus, detaching the package from the molding die.

According to the present invention, it is possible to reduce the outer thickness of the semiconductor device. Further, regardless of the presence of the ejector pin site, connection between the second current electrode and the plurality of second outer leads by the connector is realized that allows improvement in tolerance for current breakdown and reduction in on-state voltage.

It is therefore an object of the present invention to establish connection by bonding wires allowing improvement in tolerance for current breakdown and reduction in on-state voltage, even when the outer thickness of a power transistor is small and an ejector pin site exists.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
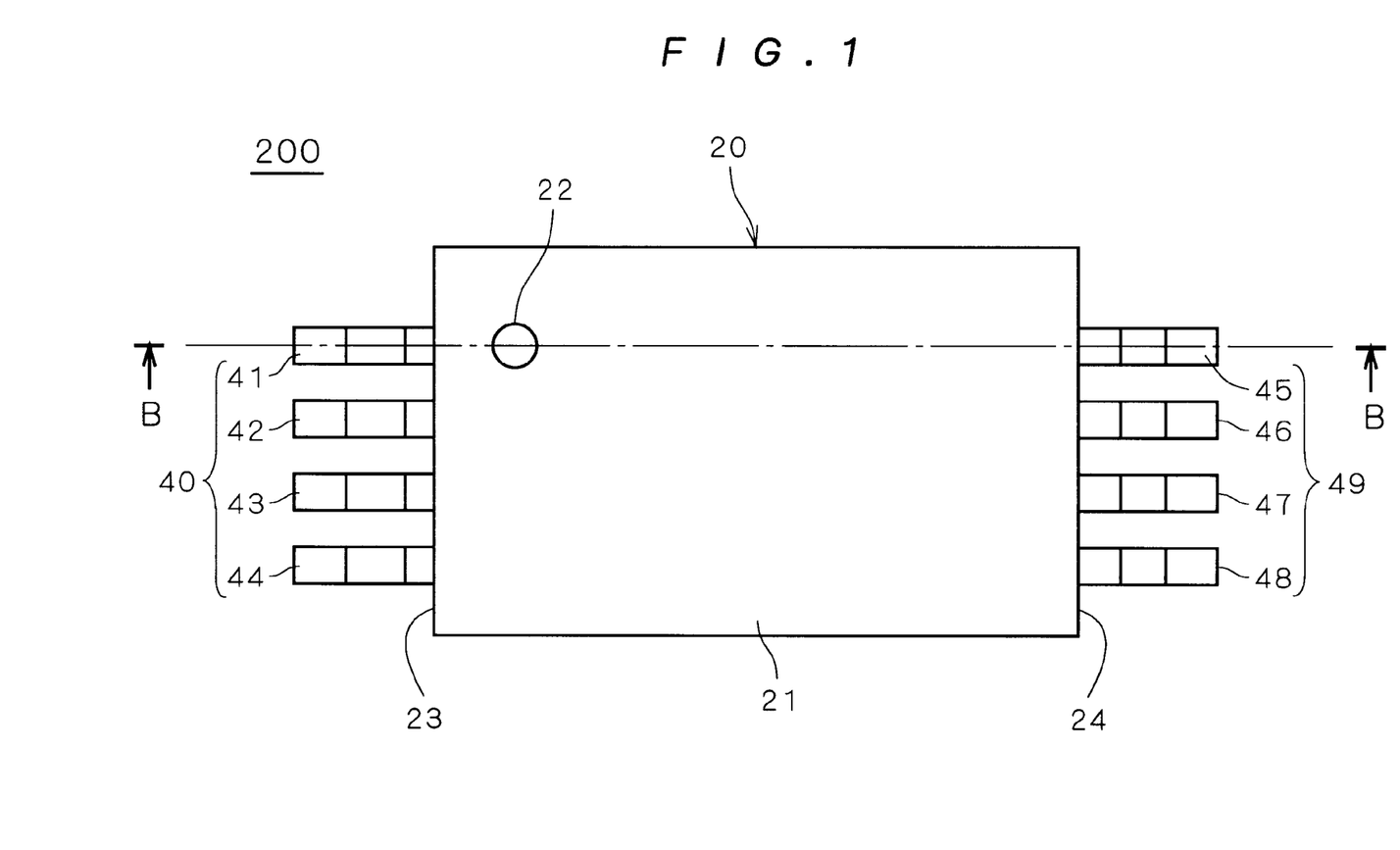
FIG. 1 is a plan view exemplifying the appearance of a semiconductor device according to a first preferred embodiment of the present invention.
Figure 2:
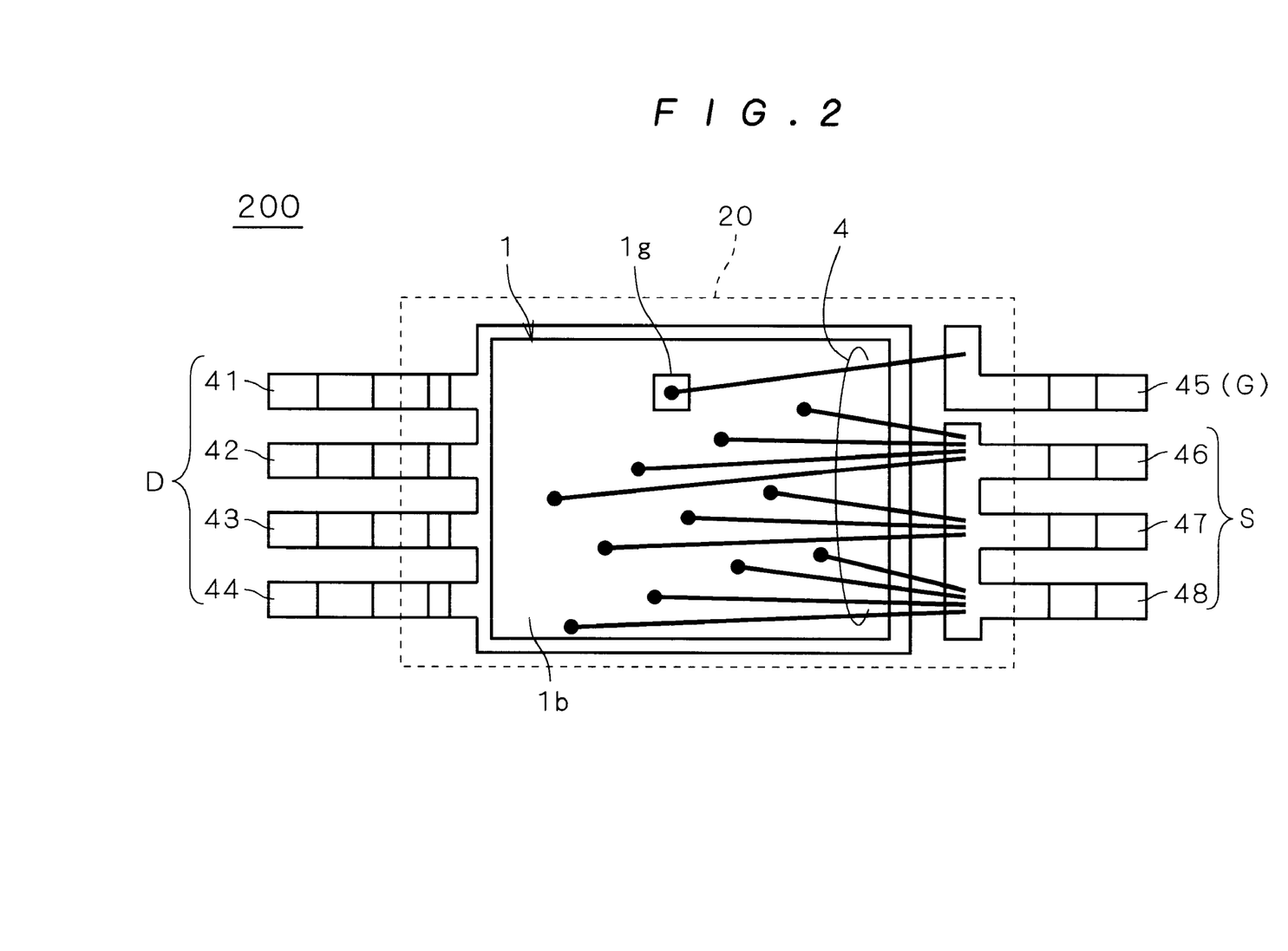
FIG. 2 is a plan view exemplifying the internal structure of the semiconductor device according to the first preferred embodiment of the present invention.
Figure 3:
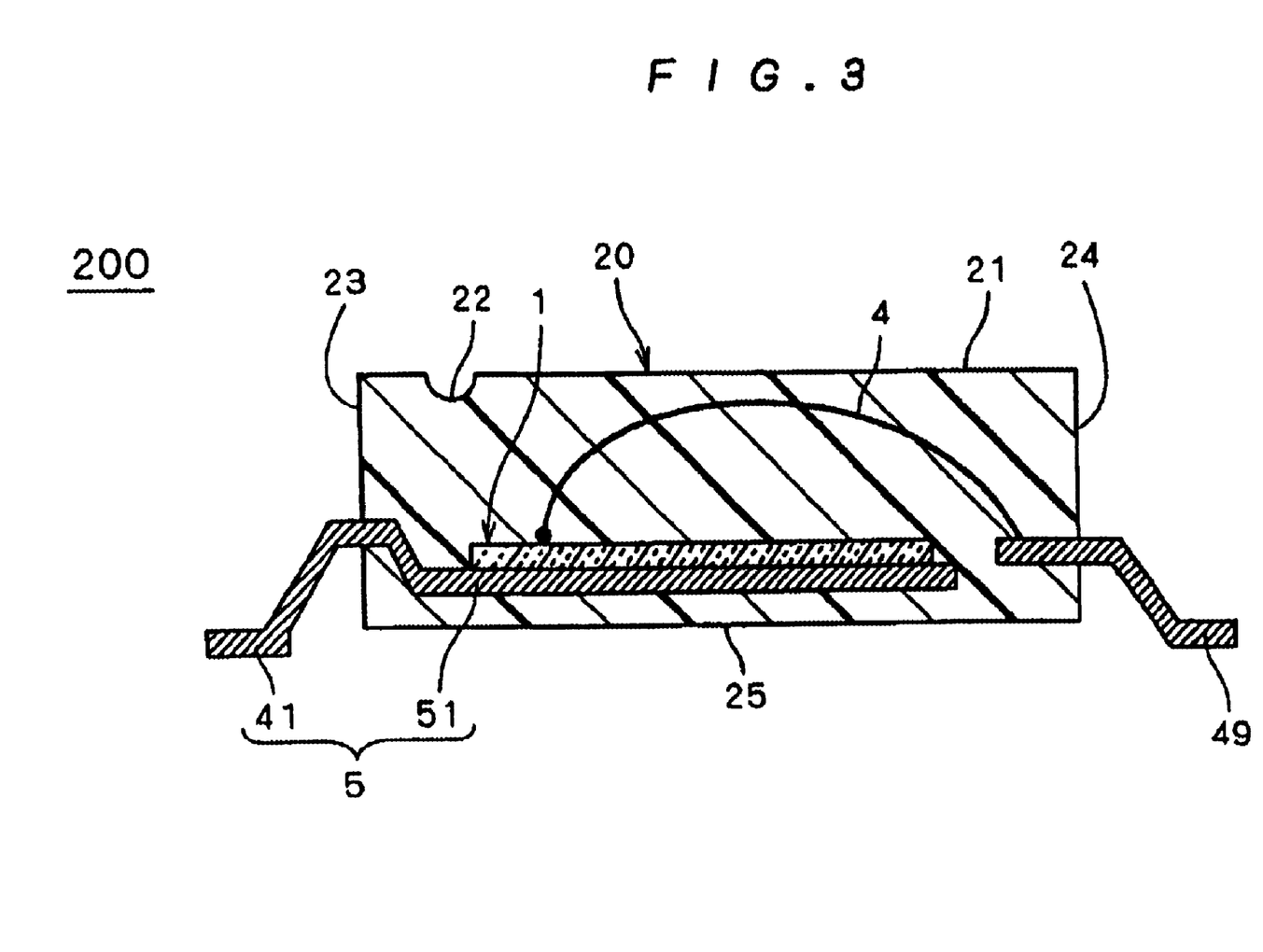
FIG. 3 is a cross-sectional view taken along a cutting plane line B—B in FIG. 1.

FIG. 1 is a plan view exemplifying the appearance of a transistor 200 as a semiconductor device according to the first preferred embodiment of the present invention. FIG. 2 is a plan view exemplifying the internal structure of the transistor 200. FIG. 3 is a cross-sectional view of the transistor 200 taken along the cutting plane line B—B in FIG. 1.

In appearance, the transistor 200 includes a resin package 20 and outer leads 41 through 48. To provide description of the internal structure of the resin package 20, only the outline thereof is shown in a dashed line in FIG. 2. The resin package 20 has a first side surface 23 and a second side surface 24 opposite to each other. The resin package 20 further has a top surface 21 and a bottom surface 25 opposite to each other. The outer leads 41 through 44 protruding from the first side surface 23 form a group 40. The outer leads 45 through 48 protruding from the second side surface 24 form a group 49.

The transistor 200 is provided with a semiconductor chip 1, a lead frame 5 and bonding wires 4 inside the resin package 20. The lead frame 5 includes the group 40 of outer leads at one end and a sheet-like portion 51 for holding the semiconductor chip 1 mounted thereon from the side of the bottom surface 25. That is, the bottom surface 25 is located farther from the semiconductor chip 1 than the lead frame 5. One end of each bonding wire 4 is bonded to the semiconductor chip 1 from the side of the top surface 21 and the other end thereof is connected to one of the outer leads of the group 49. That is, the top surface 21 is located farther from the semiconductor chip 1 than the wires 4.

Figure 4:
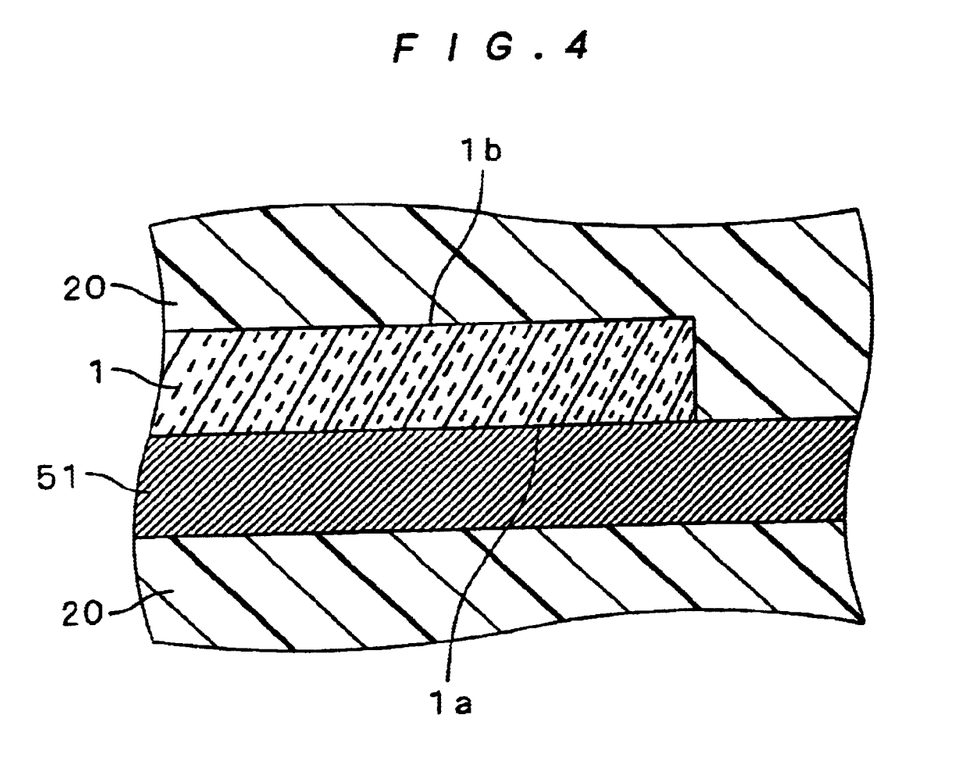
FIG. 4 is an enlarged sectional view of the structure in FIG. 3.

FIG. 4 is an enlarged sectional view of the boundary and its vicinity between the semiconductor chip 1 and the sheet-like portion 51. When the semiconductor chip 1 is a power MOS transistor, a drain electrode is generally provided on the side of a first surface 1a of the chip 1 and source and gate electrodes are generally on the side of a second surface 1b thereof opposite to the first surface 1a. In the present invention, the sheet-like portion 51 is connected to the chip 1 at the first surface 1a and each of the outer leads 41 through 44 serves as an external drain electrode D. One of the plurality of wires 4 connects a gate electrode 1g of the semiconductor chip 1 and the outer lead 45. The outer lead 45 serves as an external gate electrode G accordingly. The remaining wires 4 connect the outer leads 46 through 48 and the source electrode provided on the second surface 1b.

When the transistor 200 acts as a power semiconductor device, e.g., when the semiconductor chip 1 is a MOS transistor, it is desirable to reduce on-state voltage across a pair of current electrodes for forming both ends of a current path inside the MOS transistor, namely, on-state voltage across the source and the drain. Such reduction is desired especially in the case where the transistor 200 has the TSSOP configuration and is to be employed in a portable device. This is because the portable device requires operating voltage to be set low, thereby allowing reduction in power consumption.

In order to realize the foregoing reduction in on-state voltage, sheet resistance in the surface of the semiconductor chip 1 is desirably reduced. The plurality of wires 4 to be connected to the outer leads 46 through 48 are bonded to the separate positions on the source electrode on the second surface 1b, thereby allowing reduction in sheet resistance. Such bonding from the separate positions contribute to the avoidance of high current density in the wires 4. As illustrated in FIG. 2, the outer leads 46 through 48 may be integrally formed.

Similar to the background art, the resin package 20 according to the first preferred embodiment is completed by bonding the semiconductor chip 1 to the lead frame 5, establishing connection by the bonding wires 4 and performing sealing with a resin using a known technique. An ejector pin site 22 is formed on the top surface 21 of the resin package 20. More particularly, the ejector pin site 22 is located on the side of the first side surface 23. As the outer leads 46 through 48 are arranged on the side of the second side surface 24, the wires 4 can be bonded to the widely separated positions on the second surface 1b without the need of placing the wires 4 between the ejector pin site 22 and the semiconductor chip 1. Further, even when the bonding wires 4 are each suspended above the semiconductor chip 1 at a great height, it is quite unlikely that the bonding wires 4 will be exposed from the top surface 21 to the outside of the resin package 20 resulting from the presence of the ejector pin site 22.

According to the foregoing structure of the semiconductor device in the first preferred embodiment, it is possible to reduce the outer thickness of the transistor, especially of the power transistor. Further, regardless of the presence of the ejector pin site, connection by the bonding wires is realized that allows improvement in tolerance for current breakdown and reduction in on-state voltage.

The ejector pin site 22 may be alternatively provided in the vicinity of the outer lead 41, for example. In this case, the first preferred embodiment is also advantageous in that the outer leads 41 through 48 become more distinguishable.

Second Preferred Embodiment

Figure 5:
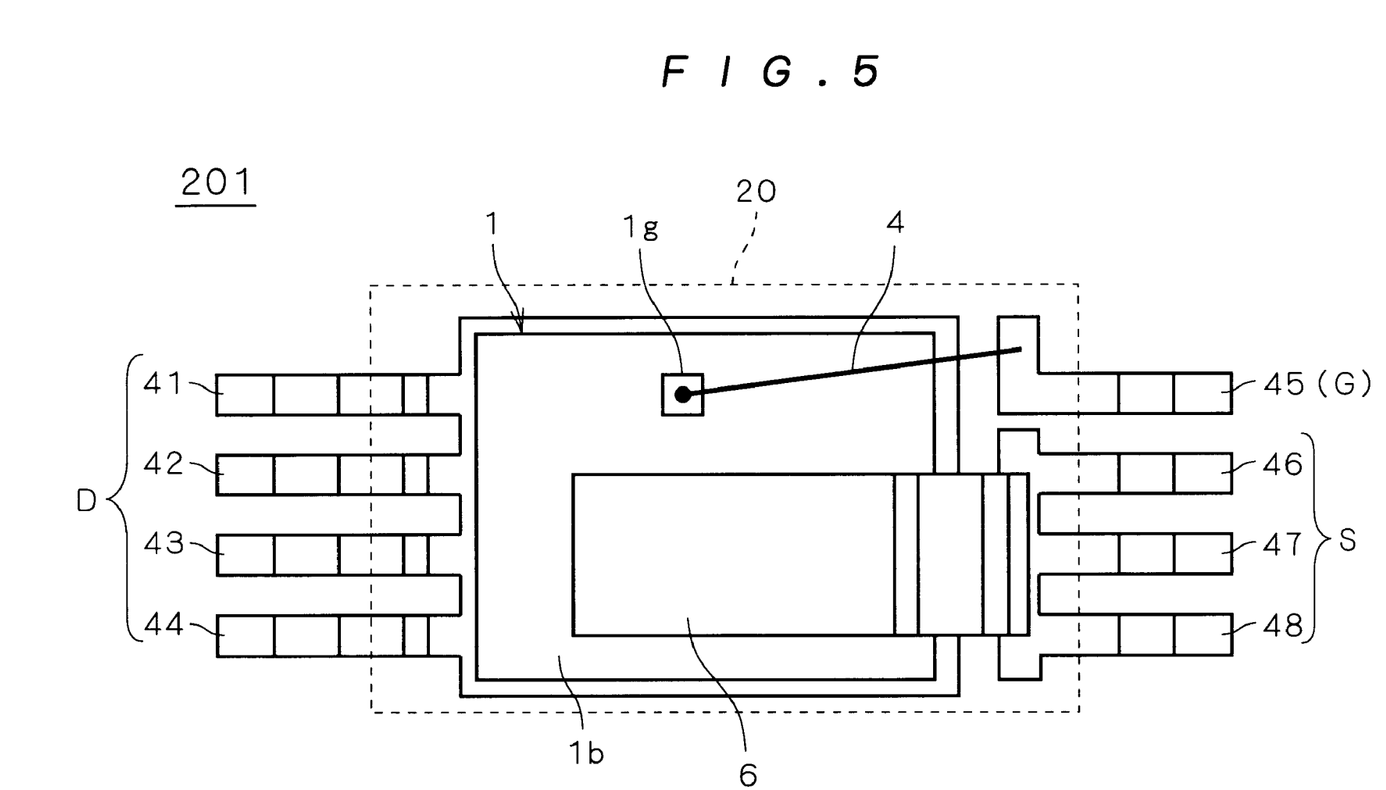
FIG. 5 is a plan view exemplifying the internal structure of a semiconductor device according to a second preferred embodiment of the present invention.
Figure 6:
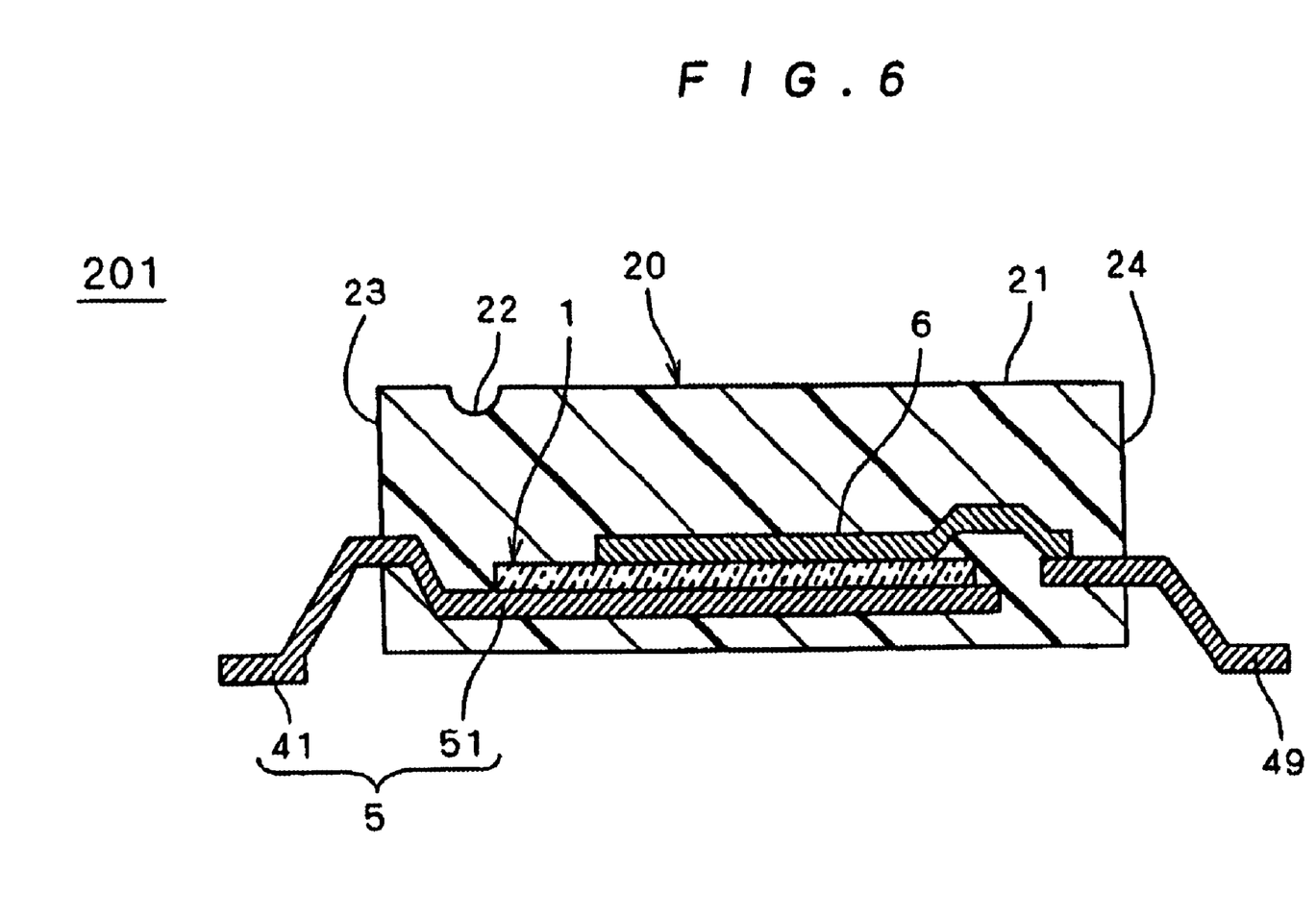
FIG. 6 is a cross-sectional view illustrating the semiconductor device according to the second preferred embodiment of the present invention.

FIG. 5 is a plan view and FIG. 6 is a cross-sectional view each exemplifying the internal structure of a transistor 201 as a semiconductor device according to the second preferred embodiment of the present invention. FIGS. 5 and 6 are corresponding to FIGS. 2 and 3, respectively.

The transistor 201 according to the second preferred embodiment differs from the transistor 200 only in that the outer leads 46 through 48 and the source electrode on the second surface 1b are bonded with a metal plate 6. The metal plate 6 is bonded to the large area of the source electrode on the second surface 1b. As a result, similar to the bonding using the plurality of wires 4 in the first preferred embodiment, sheet resistance in the surface of the semiconductor chip 1 is also reduced. Further, current density in the drain electrode is kept low.

In the foregoing two preferred embodiments, the transistors 200 and 201 are each shown as a MOS transistor. Alternatively, the present invention is also applicable to an IGBT (insulated gate bipolar transistor). The present invention requiring connection by the metal plate 6 or the plurality of wires 4 corresponding thereto are desired especially when high current and saturation voltage resulting in loss in on-state should be reduced in an IGBT for strobe light flashing. When the present invention is applied to an IGBT, a collector electrode and an emitter electrode may be substituted for the drain electrode and the source electrode in the foregoing description, respectively.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor chip;
   a lead frame connected to the semiconductor chip;
   a plurality of first outer leads connected by the lead frame to the semiconductor chip;
   a plurality of second outer leads;
   at least one connector connecting the plurality of second outer leads to the semiconductor chip; and
   a package;
   said semiconductor chip including,
      a semiconductor element having a first current electrode and a second current electrode,
      a first semiconductor element surface holding said first current electrode, and
      a second semiconductor element surface holding said second current electrode, said second semiconductor element surface being opposite to said first semiconductor element surface;
   said lead frame including,
      a sheet-like portion connected to said first current electrode on said first semiconductor element surface of said semiconductor chip, and
      an end portion comprising said plurality of first outer leads;
   said plurality of second outer leads connected to said second current electrode by said at least one connector; and
   said package including,
      a first side surface holding said plurality of first outer leads arranged thereon,
      a second side surface holding said plurality of second outer leads arranged thereon, said second side surface being opposite to said first side surface,
      a first packaging surface located farther from said semiconductor chip than said lead frame,
      a second packaging surface located farther from said semiconductor chip than said at least one connector, said second packaging surface being opposite to said first packaging surface, and
      a recessed portion formed on said second packaging surface closer to said first side surface than said second side surface.

2. The semiconductor device according to claim 1, wherein
   said recessed portion is a recess site formed when said package is ejected from a molding die.

3. The semiconductor device according to claim 1, wherein
   said semiconductor element is a MOS transistor; and
   said first current electrode and said second current electrode are a drain and a source, respectively.

4. The semiconductor device according to claim 1, wherein
   said semiconductor element is an IGBT; and
   said first current electrode and said second current electrode are a collector and an emitter, respectively.

5. The semiconductor device according to claim 1, wherein
   said semiconductor device has a TSSOP configuration in external form.

6. The semiconductor device according to claim 1, wherein
   said at least one connector includes a plurality of metal wires.

7. The semiconductor device according to claim 6, wherein
   said plurality of metal wires are connected to separate positions on said second current electrode.

8. The semiconductor device according to claim 7, wherein
   said plurality of second outer leads are integrally formed.

9. The semiconductor device according to claim 1, wherein
   said at least one connector is a metal plate.

10. The semiconductor device according to claim 9, wherein
    said plurality of second outer leads are integrally formed.

11. The semiconductor device according to claim 1, wherein said semiconductor element further has a gate electrode, and said semiconductor device further comprises a third outer lead arranged on said second side surface of said package and connected to said gate electrode.

12. The semiconductor device according to claim 1, wherein said recessed portion is located in the vicinity of one of said plurality of first outer leads.

* * * * *